United States Patent
Song et al.

(10) Patent No.: US 7,333,559 B2
(45) Date of Patent: Feb. 19, 2008

(54) DIGITAL PREDISTORTER FOR A WIDEBAND POWER AMPLIFIER AND ADAPTATION METHOD

(75) Inventors: Yoo-Seung Song, Suwon-si (KR); Ki-Hwan Hwang, Andong-si (KR)

(73) Assignee: Samsung Electronics Co. Ltd., Suwon-si (KR)

( * ) Notice: Subject to any disclaimer, the term of this patent is extended or adjusted under 35 U.S.C. 154(b) by 695 days.

(21) Appl. No.: 10/744,087

(22) Filed: Dec. 24, 2003

(65) Prior Publication Data

US 2004/0179629 A1    Sep. 16, 2004

(30) Foreign Application Priority Data

Dec. 24, 2002    (KR) ................. 10-2002-0083377

(51) Int. Cl.
*H04K 1/02* (2006.01)
(52) U.S. Cl. .................................... 375/296
(58) Field of Classification Search ............... 375/295, 375/296; 398/193; 455/114.3, 63.1; 327/133; 330/149
See application file for complete search history.

(56) References Cited

U.S. PATENT DOCUMENTS

| | | | |
|---|---|---|---|
| 5,825,871 A * | 10/1998 | Mark ................ | 379/357.03 |
| 6,141,390 A * | 10/2000 | Cova ................ | 375/297 |
| 6,928,122 B2 * | 8/2005 | Opas et al. ........ | 375/296 |
| 6,990,083 B1 * | 1/2006 | Reina ............... | 370/286 |
| 7,006,474 B2 * | 2/2006 | Oates et al. ....... | 370/334 |
| 7,068,980 B2 * | 6/2006 | Seo et al. ......... | 455/91 |
| 2002/0041210 A1 * | 4/2002 | Booth et al. ...... | 330/149 |
| 2003/0058959 A1 * | 3/2003 | Rafie et al. ....... | 375/296 |
| 2003/0202615 A1 * | 10/2003 | Bach et al. ....... | 375/296 |
| 2003/0223509 A1 * | 12/2003 | Ma .................. | 375/296 |
| 2006/0240786 A1 * | 10/2006 | Liu .................. | 455/114.3 |

* cited by examiner

Primary Examiner—David C. Payne
Assistant Examiner—Leon-Viet Q Nguyen
(74) *Attorney, Agent, or Firm*—Roylance, Abrams, Berdo & Goodman, L.L.P.

(57) ABSTRACT

An apparatus and method for eliminating the spurious signal of a non-linear amplifier in a base station transmitter of a mobile communication system are provided. A digital predistorter includes first and second predistorters, each having a memoryless non-linearity part using a look-up table and a memory non-linearity part using an finite impulse response (FIR) filter. The first predistorter adaptively updates the look-up tables, while the second predistorter adaptively updates the filtering coefficients of the FIR filters. According to another embodiment of the present invention, a digital predistorter has a memoryless non-linearity part using a look-up table and a memory non-linearity part using an FIR filter, and adaptively updates the look-up table and the filtering coefficients of the FIR filter.

20 Claims, 10 Drawing Sheets

DIGITAL PREDISTORTER FOR A WIDEBAND POWER AMPLIFIER AND ADAPTATION METHOD

PRIORITY

This application claims priority under 35 U.S.C. § 119 to an application entitled "Digital Predistorter for a Wideband Power Amplifier and Adaptation Method Therefor" filed in the Korean Intellectual Property Office on Dec. 24, 2002 and assigned Ser. No. 2002-83377, the contents of which are incorporated herein by reference.

BACKGROUND OF THE INVENTION

1. Field of the Invention

The present invention relates generally to wideband power amplification, and in particular, to a predistorter for linearly amplifying a wideband Radio Frequency (RF) signal and a method of adapting the predistorter.

2. Description of the Related Art

RF amplifiers are used in a typical mobile communication system and communicate via RF signals. The RF amplifiers are divided into low-power, low-noise receive amplifiers and high-power transmit amplifiers. Efficiency is a more significant consideration than noise in a high-power transmit amplifier. A high-power amplifier (HPA), widely used to achieve high efficiency in mobile communication applications, operates near a non-linear operation point.

Intermodulation distortion (IMD) from the amplifier output adversely affects out of band frequencies as well as in band frequencies with spurious signals. A feed forward method is usually adopted to eliminate the spurious component. Despite the advantage of complete elimination of the spurious component, however, the feed forward method has a low amplification efficiency and requires control at an RF stage. Therefore, the HPA becomes bulky and system cost is increased.

Digital predistortion (DPD) is being studied as a means to achieve high efficiency and low cost in the mobile communication industry. The DPD preliminarily compensates for the losses of an input signal by adding an inverse of the non-linearity of a non-linear amplifier and renders the output of the non-linear amplifier linear. The non-linearity of the non-linear amplifier is represented as Amplitude Modulation to Amplitude Modulation (AM to AM) conversion distortion and Amplitude Modulation to Phase Modulation (AM to PM) conversion distortion. The AM to AM conversion distortion is defined as a change in the amplitude of an output signal with the amplitude of an input signal, while the AM to PM conversion distortion is defined as a change in the phase of the output signal with the amplitude of the input signal.

Most predistorters work for single tone signals or narrow band frequency signals. Therefore, they generally compensate for the memoryless non-linearity of a non-linear amplifier without considering memory effects. The memoryless non-linearity refers to the present output being influenced by the present input only. However, the memoryless non-linearity of the non-linear amplifier at a wideband frequency causes previous input signals as well as the present input signal to affect the present amplifier output, thereby substantially changing the AM to AM and AM to PM characteristics. This phenomenon is called memory effects. The non-linearity of a power amplifier varies with the frequency of an input signal.

The increasing use of wideband frequencies in mobile communication systems has driven research and development toward the memoryless effects of non-linear amplifies. The main techniques of compensating for both the memoryless non-linearity and memory effects of a non-linear amplifier are a simplified Volterra model, a memory polynomial model, and Hammerstein predistortion.

A Volterra series can be seen as a Taylor series with a memory. The Volterra series is used to accurately model a non-linear system. Thus, a Volterra model eliminates the non-linearity of a non-linear amplifier by an inverse of a Volterra series model that simulates the non-linear amplifier. This scheme is effective in completely eliminating the non-linearity of the non-linear amplifier, but its physical implementation is almost impossible because of the required use of a complicated formula for high-order inversion and the requirement of a large volume of computations.

The memory polynomial model is a simplified version of the Volterra model. It represents an output as a polynomial of a present input and previous inputs. The ability to eliminate the non-linearity of an amplifier depends on the number of previous inputs considered and the order of the polynomial. An additional polynomial is added each time an additional previous input is considered. Therefore, the memory polynomial model is likely to increase the volume of required computation.

The Hammerstein predistortion is a serial connection of a memoryless non-linear system and a linear time invariant (LTI) system. A traditional Hammerstein model calculates accurate coefficients of the memoryless non-linear system and the LTI system by matrix inversion. The matrix inversion is a calculation of coefficients by arranging equations satisfying some conditions in the form of a matrix and finding the inverse of the matrix. This scheme also requires too many multiplications for inversion, which makes it impossible to physically implement the Hammerstein predistortion.

SUMMARY OF THE INVENTION

An object of the present invention is to substantially solve at least the above problems. Accordingly, an object of the present invention is to provide a high-efficiency, inexpensive predistorter and a predistortion method for eliminating distortion involving amplification of a non-linear power amplifier.

Another object of the present invention is to provide a predistorter and a predistortion method that operate with a reduced computation and memory capacity in a wideband mobile communication system.

A further object of the present invention is to provide a predistorter and a predistortion method that effectively eliminate the memoryless and memory non-linearities of a power amplifier in a digital stage.

Still another object of the present invention is to provide a digital predistorter and a predistortion method for a power amplifier, which adaptively update a memoryless non-linearity part and an linear time invariant (LTI) part using an indirect learning architecture.

The above objects are substantially achieved by a digital predistortion apparatus and method for predistorting an input digital signal to compensate for the memoryless and memory non-linearities of a wideband power amplifier that amplifies the digital signal.

According to an aspect of the present invention, in a digital predistortion apparatus, a first predistorter receives the digital signal, and is connected to the power amplifier through a digital to analog converter (DAC) and a frequency upconverter. The first predistorter includes a first memoryless non-linearity part for compensating for the memoryless non-linearity using a first look up table (LUT) and a first memory non-linearity part for compensating for the memory non-linearity using a first finite impulse response (FIR) filter. A second predistorter receives an amplified digital signal from the power amplifier through an analog to digital converter (ADC) and a frequency downconverter. The second predistorter includes a second memoryless non-linearity part for compensating for the memoryless non-linearity using a second LUT having the same values as the first LUT and a second memory non-linearity part for compensating for the memory non-linearity using a second FIR filter having the same filtering coefficients as the first FIR filter. The first predistorter directly updates the first LUT, while the second predistorter indirectly updates the first FIR filter using the second FIR filter.

According to another aspect of the present invention, a digital predistorter is connected to the power amplifier through a DAC and a frequency upconverter, and predistorts the digital signal using the feedback signal received from the power amplifier through a frequency downconverter and an ADC. In the digital predistorter, a memoryless non-linearity part compensates for the memoryless non-linearity using an LUT and updates the LUT using a feedback signal from the power amplifier, while a memory non-linearity part compensates for the memory non-linearity using an FIR filter and updates filtering coefficients of the FIR filter using the feedback signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Several embodiments of the present invention will be described herein below with reference to the accompanying drawings. In the following description, well-known functions or constructions are not described in detail for conciseness.

The embodiments of the present invention as described hereinbelow pertains to elimination of distortion generated in amplifying a transmission signal, particularly to adaptive updating of a memoryless non-linearity part and a memory non-linearity part in a digital predistorter for a power amplifier in a wideband mobile communication system. The embodiments of the present invention further provide an adaptive algorithm that can be easily implemented as an Field Programmable Gate Array (FPGA) or a Digital Signaling Processor (DSP) under a high data rate environment. The adaptive algorithm refers to a method of continuously updating an initial value, while reducing certain errors, to thereby find an optimal value.

To eliminate memoryless non-linearity and memory effects arising from a power amplifier in a wideband mobile communication system, a Hammerstein predistorter adopts a memoryless non-linear system for compensating the memoryless non-linearity demonstrated as amplitude modulation to amplitude modulation (AM to AM) and amplitude modulation to phase modulation (AM to PM) characteristics, and a linear time invariant (LTI) system for compensating for the memory non-linearity incidents of the memory effects.

In accordance with an embodiment of the present invention, the memoryless non-linear system uses a look-up table and thus it is quickly updated in a direct learning architecture, while the memory non-linear system (i.e. LTI system) is updated in an indirect learning architecture. The indirect learning architecture indirectly finds a formula representing the inverse of power amplifier characteristics using a training predistorter and applying the inversion formula to an actual predistorter having the same configuration.

Figure 1:
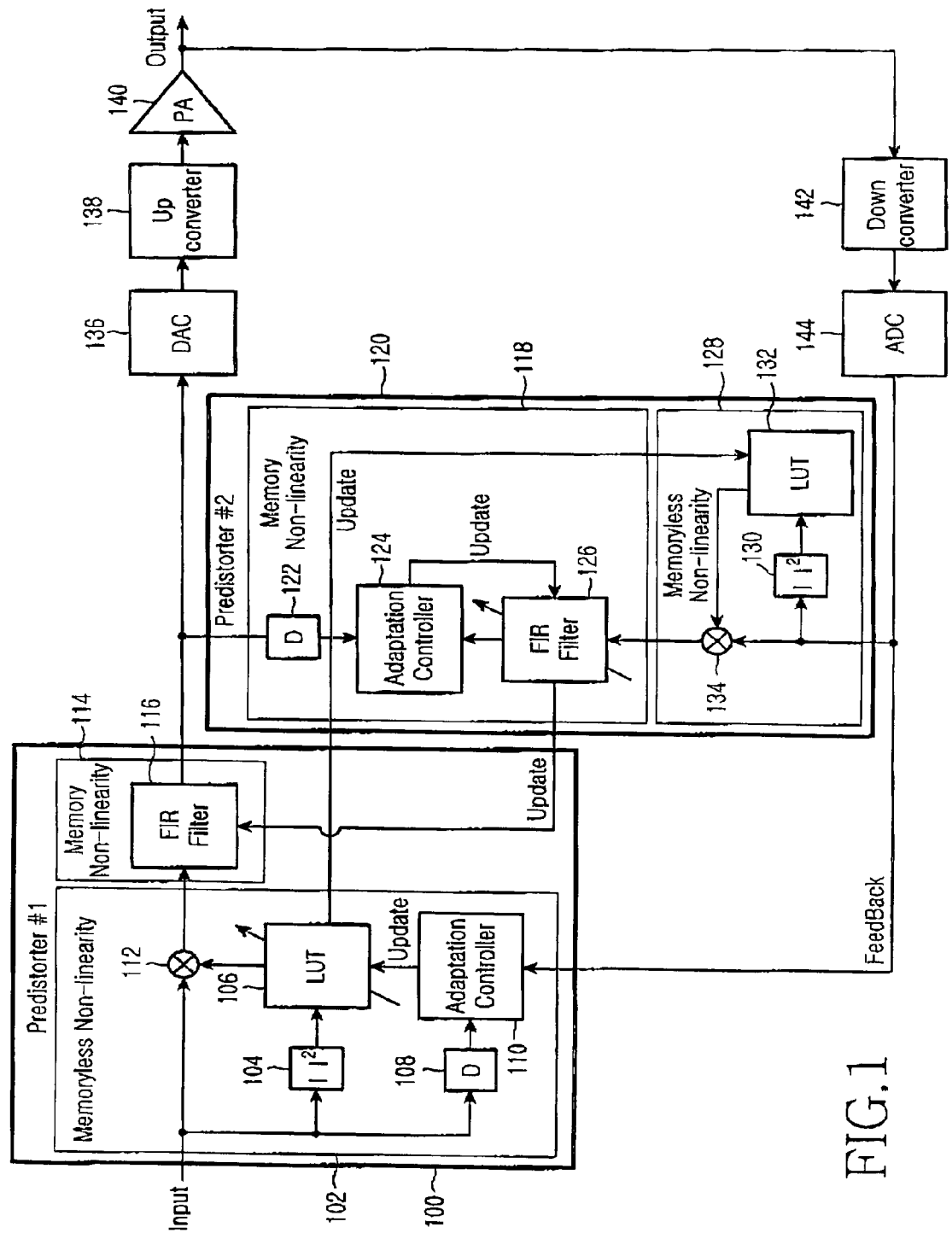
FIG. 1 is a block diagram of a transmitter that outputs a linearized amplified signal using predistortion according to an embodiment of the present invention.

FIG. 1 is a block diagram of a transmitter for outputting a linearlized amplified signal based on predistortion according to an embodiment of the present invention.

Referring to FIG. 1, the transmitter comprises two first and second predistorters 100 and 120 having a Hammerstein power amplifier structure in order to predict non-linear distortions caused by a power amplifier 140. The predistorters 100 and 120 respectively have a memoryless non-linearity part 102 & a memory non-linearity part 114, and a memoryless non-linearity part 128 & a memory non-linearity part 118. The first predistorter 100 is connected to the power amplifier 140 through a digital to analog converter (DAC) 136 and a frequency upconverter 138. The power amplifier 140 is connected to the second predistorter 120 through a frequency downconverter 142 and an analog to digital converter (ADC) 144.

The first and second predistorters 100 and 120 compensate for the memoryless non-linearity and memory effects of the non-linear amplifier, respectively. The first predistorter 100 adaptively updates the memoryless non-linearity parts 102 and 128, while the second predistorter 120 adaptively updates the memory non-linearity parts 114 and 118.

In the memoryless non-linearity part 102 of the first predistorter 100, an amplitude calculator 104 calculates the amplitude of a digital input and determines a read address in order to read a distortion control value corresponding to the amplitude from a look-up table (LUT) 106. The amplitude is the sum of the square of the in-phase (I channel, i.e. real number part) component of the input and the square of the quadrature-phase (Q channel, i.e. imaginary number part) component of the input.

The LUT 106 outputs the distortion control value at the read address. The LUT 106 outputs distortion control values, as digital data, corresponding to the amplitudes of all possible inputs according to the memoryless non-linearity of the power amplifier 140. The LUT 106 initially stores predetermined values, that is, 1s or default values set by a manufacturer.

A delay 108 delays the input by a predetermined time. A first adaptation controller 110 compares the delayed signal with a feedback signal received from the power amplifier 140 through the frequency downconverter 142 and the ADC 144 and updates the LUT 106 adaptively according to the comparison result by a secant algorithm.

The secant algorithm locates a root without differentiation based on the principle that the inclination of a line including an initial approximate solution converges to zero as the initial approximate solution approaches the root of a function. The formula for the scant algorithm is given as $$F_i(k+1) = \frac{F_i(k-1)e_i(k) - F_i(k)e_i(k-1)}{e_i(k) - e_i(k-1)} \quad (1)$$

where k is an index indicating the number of updates, i is an index indicating an address in the LUT, $F_i(k)$ is a distortion control value at an ith address of the LUT updated k times, and $e_i(k)$ is an error obtained by subtracting an expected amplification value for the delayed signal output from the delay 108 from the feedback signal output from the power amplifier 140. The expected amplification value is the product of the delayed signal and an ideal gain for the power amplifier 140.

A multiplier 112 complex-multiplies the input by the distortion control value read from the LUT 106, thereby compensating for the memoryless non-linearity of the power amplifier 140. Specifically, the multiplier 112 multiplies the I and Q channel components of the digital input by I and Q channel components read from the LUT 106, respectively, multiplies the product of the Q channel components by −1, and sums the products.

In the memory non-linearity part 114, a finite impulse response (FIR) filter 116 having a predetermined number of taps filters the signal received from the multiplier 112, thereby generating a predistorted signal. The FIR filter 116 forms an LTI system for compensating for the dependency of the non-linearity of the power amplifier 140 on the frequency of the input signal, that is, the memory effects of the power amplifier 140.

The DAC 136 converts the predistorted signal to an analog signal and the frequency upconverter 138 upconverts the frequency of the analog signal to a desired carrier frequency band. The power amplifier 140 then amplifies the upconverted signal, with the non-linearity of the signal compensated for.

Meanwhile, in the feedback path, the frequency downconverter 142 downconverts the frequency of the amplified signal to an intermediate frequency (IF) band, and the ADC 144 converts the downconverted signal to a digital signal, to generate the feedback signal for the amplifier output. The feedback signal is provided to the first adaptation controller 110 of the first predistorter 100 and to the memoryless non-linearity part 128 of the second predistorter 120.

The second predistorter 120 updates parameters for the FIR filter 116 of the first predistorter 100, that is, filtering coefficients in order to compensate for the memory effects of the power amplifier 140. An amplitude calculator 130 of the memoryless non-linearity part 128 determines a read address of an LUT 132 by calculating the amplitude of the feedback signal.

The LUT 132 outputs a distortion control value at the read address. The LUT 132 initially stores predetermined values, for example 1s or default values set by the manufacturer, like the LUT 106. The LUT 132, connected to the LUT 106, reflects the updates of the LUT 106.

A multiplier 134 complex-multiplies the feedback signal by the distortion control value read from the LUT 132. In the memory non-linearity part 118, an FIR filter 126 having the same number of taps as the FIR filter 116 filters the signal received from the multiplier 134.

A delay 122 delays the predistorted signal received from the first predistorter 100 by a predetermined time. A second adaptation controller 124 compares the delayed signal with the signal received from the FIR filter 126 and updates the filtering coefficients of the FIR filter 126 using Normalized Least Mean Square (NLMS) adaptation according to the comparison result. The NLMS traces optimum filtering coefficients such that the error between the output of the FIR filter 126 and a target value is zero. The NLMS is expressed as $$\underline{w}(k+1) = \underline{w}(k) + \frac{\mu \underline{u}(k)e^*(k)}{\|\underline{u}(k)\|^2} \quad (2)$$

where w(k) is a kth coefficient of the FIR filter, u(k) is a signal input to the FIR filter, e is a value obtained by subtracting the FIR filter output from the delayed signal from the delay 122, μ is a convergence coefficient (μ<1), * represents conjugation, and $\|\cdot\|^2$ represents summation of the squares of respective input vector elements.

Since the FIR filter 126 of the second predistorter 120 is connected to the counterpart FIR 116 of the first predistorter 100, the FIR filter 116 reflects the updated coefficients of the FIR filter 126.

As the above operation repeats, the LUT 106 and the FIR filter 116 of the first predistorter 100 converge to optimum states to compensate for the memoryless non-linearity and memory non-linearity of the power amplifier 140.

The transmitter having the above configuration according to the embodiment of the present invention does not require information concerning the characteristics of the non-linear amplifier because of its indirect learning architecture.

Figure 2:
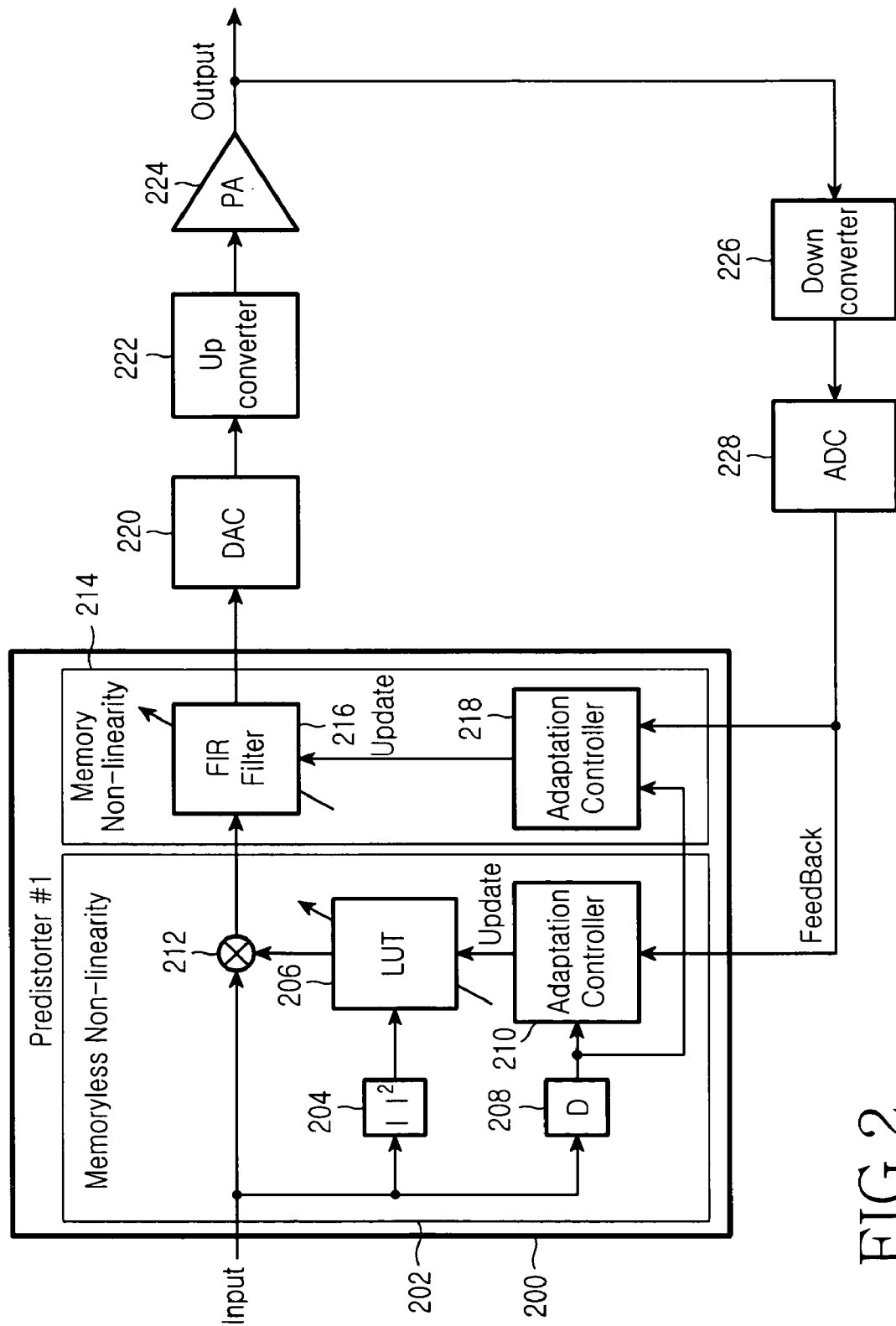
FIG. 2 is a block diagram of a transmitter that outputs a linearized amplified signal using predistortion according to another embodiment of the present invention.

FIG. 2 is a block diagram of a transmitter for outputting a linearized amplified signal based on predistortion according to another embodiment of the present invention.

Referring to FIG. 2, the transmitter comprises a predistorter 200 having a Hammerstein power amplifier structure in order to predict non-linear distortions caused by a power amplifier 224. The predistorter 200 has a memoryless non-linearity part 202 and a memory non-linearity part 214. The predistorter 200 is connected to the power amplifier 224 through a DAC 220 and a frequency upconverter 222. The power amplifier 224 is also connected to the predistorter 200 through a frequency downconverter 226 and an ADC 228. The predistorter 200 adaptively updates the memoryless non-linearity part 202 and the memory non-linearity part 214.

In the memoryless non-linearity part 202 of the predistorter 200, an amplitude calculator 204 calculates the amplitude of a digital input and determines a read address to read a distortion control value corresponding to the amplitude from a LUT 206. The LUT 206 outputs the distortion control value at the read address. The LUT 206 outputs distortion control values, as digital data, corresponding to the amplitudes of all possible inputs according to the memoryless non-linearity of the power amplifier 224. The LUT 206 initially stores predetermined values, for example 1s or default values set by a manufacturer.

A delay 208 delays the input by a predetermined time. A first adaptation controller 210 compares the delayed signal with a feedback signal received from the power amplifier 224 through the frequency downconverter 226 and the ADC 228 and updates the LUT 206 adaptively according to the comparison result using a secant algorithm. The formula for the scant algorithm is given as Eq. (1).

A multiplier 212 complex-multiplies the input by the distortion control value read from the LUT 206, thereby compensating for the memoryless non-linearity of the power amplifier 224. Specifically, the multiplier 212 multiplies the I and Q channel components of the digital input by I and Q channel components read from the LUT 206, respectively, multiplies the product of the Q channel components by $-1$, and sums the products.

In the memory non-linearity part 214, an FIR filter 216 having a predetermined number of taps filters the signal received from the multiplier 212, thereby generating a predistorted signal. The FIR filter 216 forms an LTI system for compensating for the dependency of the non-linearity of the power amplifier 224 on the frequency of the input signal, that is, the memory effects of the power amplifier 224.

The DAC 220 converts the predistorted signal to an analog signal and the frequency upconverter 222 upconverts the frequency of the analog signal to a desired carrier frequency band. The power amplifier 224 then amplifies the upconverted signal, with the non-linearity of the signal compensated for.

Meanwhile, in the feedback path, the frequency downconverter 226 downconverts the frequency of the amplified signal to an IF band, and the ADC 228 converts the downconverted signal to a digital signal, to generate the feedback signal for the amplifier output. The feedback signal is provided to the first adaptation controller 210 of the memoryless non-linearity part 202 and to a second adaptation controller 218 of the memory non-linearity part 214.

The second adaptation controller 218 compares the delayed signal from the delay 208 with the digital signal from the ADC 228 and updates the filtering coefficients of the FIR filter 216 using NLMS adaptation according to the comparison result. The NLMS is expressed as Eq. (2).

As the above operation repeats, the LUT 206 and the FIR filter 216 of the predistorter 200 converge to optimum states to compensate for the memoryless non-linearity and memory non-linearity of the power amplifier 224.

The predistorters described above according to the first and second embodiments of the present invention require a single-tone training signal to adapt the memoryless non-linearity part and a multi-tone training signal to adapt the memory non-linearity part. Hence, a description will be made of adaptation of the predistorters according to an embodiment of the present invention. This predistorter adaptation is applied to the configurations according to the first and second embodiments of the present invention.

Figure 3:
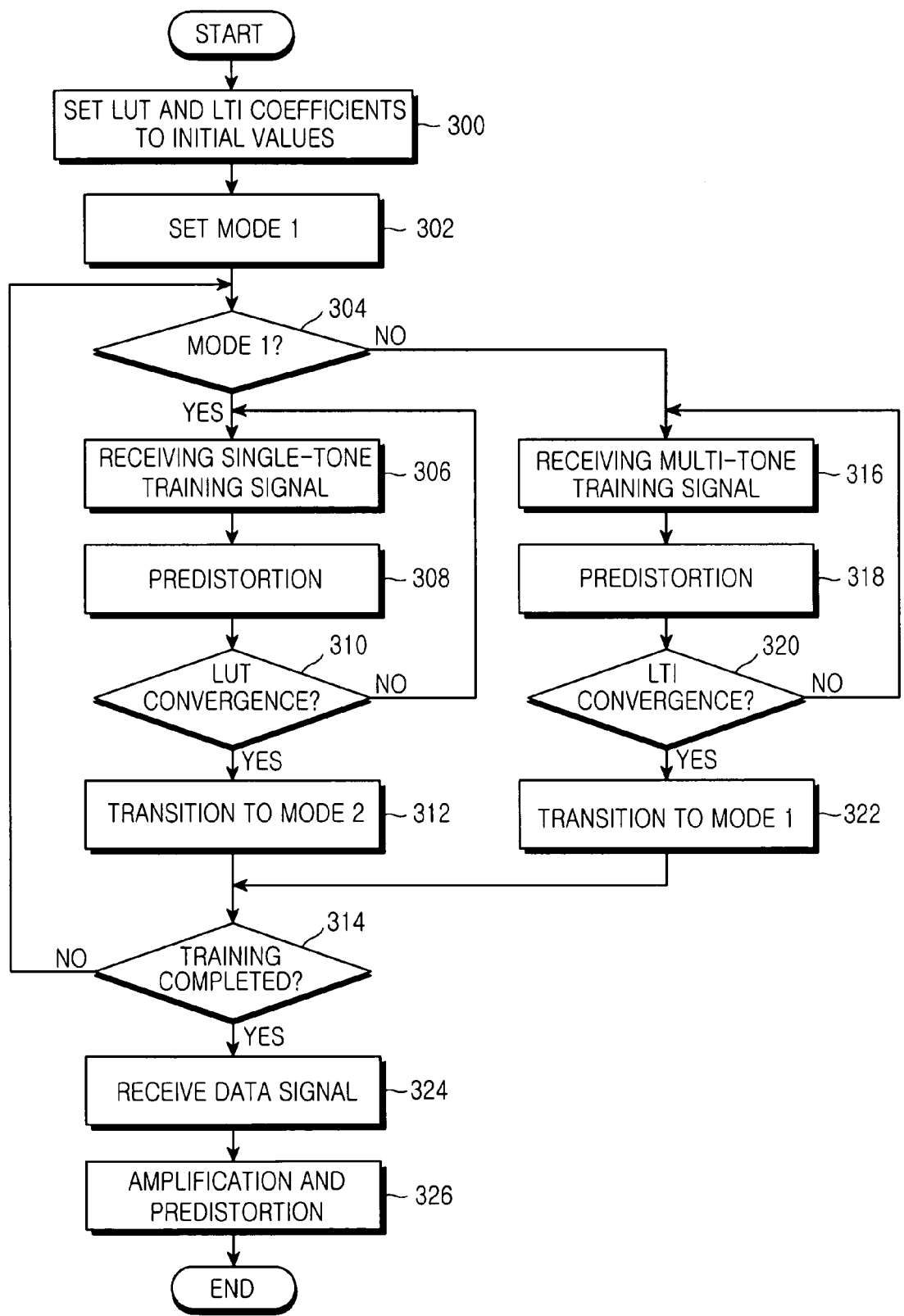
FIG. 3 is a flowchart illustrating an operation for adapting a predistorter according to an embodiment of the present invention.

FIG. 3 is a flowchart illustrating an operation for adapting a predistorter according to an embodiment of the present invention. While not shown in FIGS. 1 and 2, a main controller for controlling the predistorter is responsible for the adaptation.

Referring to FIG. 3, in step 300, an LUT is set to an initial value, 1, while a coefficient of an FIR filter corresponding to the current input is set to an initial value 1, and the other FIR filter coefficients are set to an initial value 0. A mode for adapting a memoryless non-linearity part (hereinafter, referred to as mode 1) is set in step 302 and the current mode is used to determine the type of a predistorter input in step 304.

If the present mode is mode 1, a single-tone training signal is provided to a transmitter in step 306. The single-tone training signal is, for example, a cosine signal or a sine signal. In step 308, the predistorter predistorts the input training signal. In this process, an adaptation controller of the predistorter determines an optimum value for the LUT using the input training signal and its amplified signal and updates the LUT with the optimum value.

In step 310, it is determined whether the LUT is to be updated, that is, the values of the LUT have substantially converged. The determination is made by determining whether a predetermined training time has elapsed, or whether the update degree of the LUT is equal to or less than a predetermined threshold. If the LUT values have converged, the procedure goes to step 312 otherwise, it returns to step 306 in which the LUT is continuously updated.

Meanwhile, if the current mode is not mode 1 in step 304, it is determined that the current mode is a mode for adapting a memory non-linearity part (hereinafter, referred to as mode 2) and a multi-tone training signal is provided to the transmitter in step 316. The multi-tone training signal is, for example, a wideband frequency signal having a relatively wide bandwidth. In step 318, the predistorter predistorts the input training signal. In this process, the adaptation controller of the predistorter determines optimum filtering coefficients using the input training signal and its amplified signal and updates the FIR filter with the optimum filtering coefficients. It should be noted that the LUT is not updated.

In step 320, it is determined whether the FIR filter is to be updated, that is, the filtering coefficients have substantially converged. The determination is made by determining whether a predetermined training time has elapsed, or whether the update degree of the filtering coefficients is equal to or less than a predetermined threshold. If the filtering coefficients have converged, the procedure goes to step 322 where it transitions to a memoryless non-linearity part otherwise, it returns to step 316 in which the FIR filter is continuously updated.

In step 314, it is determined whether the training has been completed in order to alternately update the LUT and the FIR filter until the predistorter is satisfactorily optimized. If the training is not completed, the procedure returns to step 304 in which the LUT and the FIR filter are updated in every predetermined period. Otherwise, the procedure goes to step 324 in which a data signal is received. In step 326, a power amplifier amplifies the data signal, while the predistorter updates the LUT and the FIR filter continuously using the data signal.

Figure 4A:
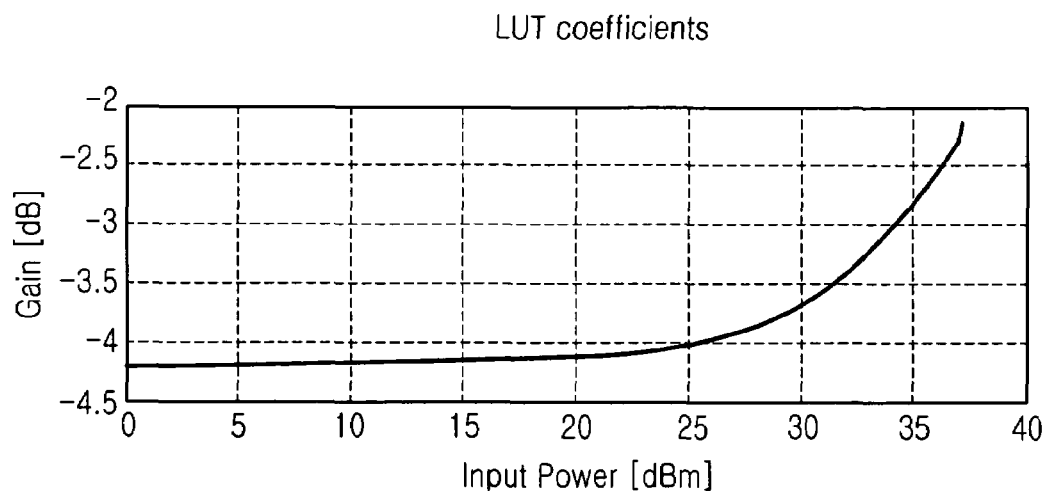
FIGS. 4A and 4B illustrate distortion control values (look up table (LUT) coefficients) stored in a look-up table to compensate for the memoryless non-linearity of a non-linear amplifier in a predistorter according to the first embodiment of the present invention.
Figure 4B:
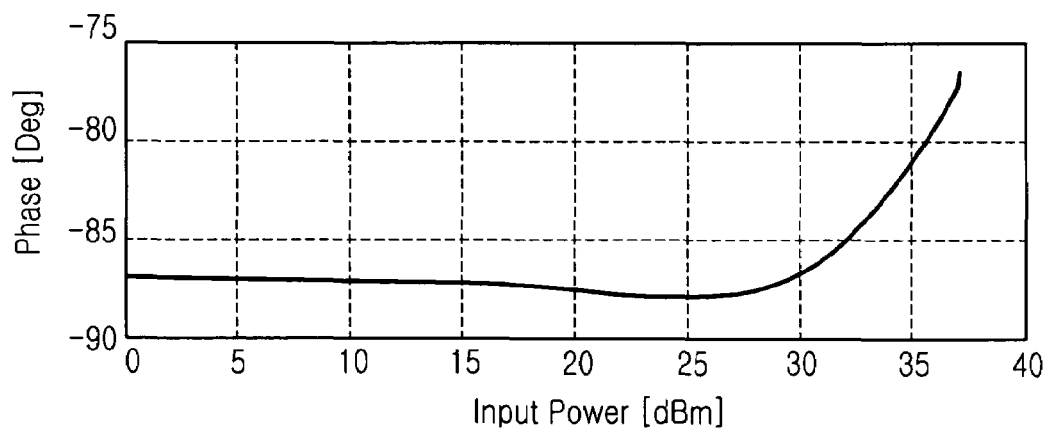
Figure 5:
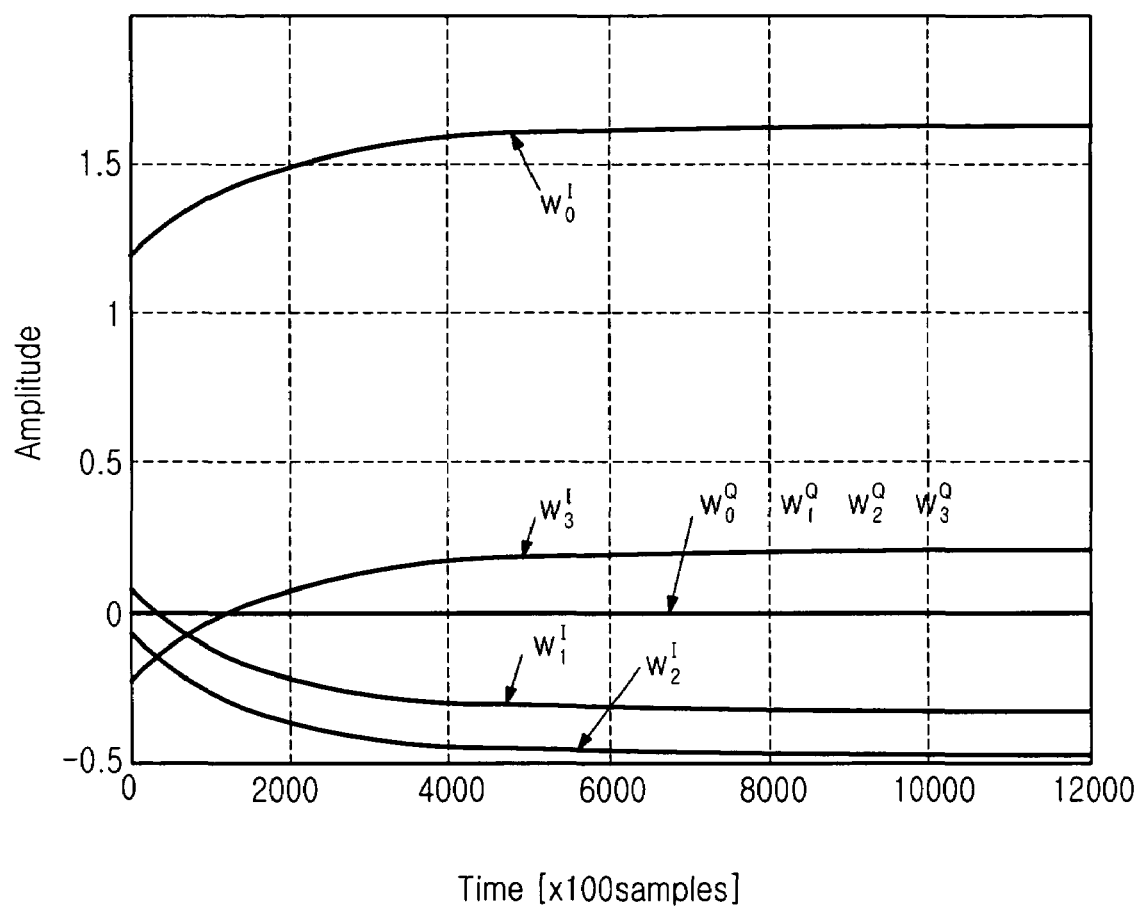
FIG. 5 is a graph illustrating the convergence of filtering coefficients to compensate for the memory non-linearity of the non-linear power amplifier in the predistorter according to the first embodiment of the present invention.

FIGS. 4A and 4B illustrate distortion control values (LUT coefficients) stored in the LUT to compensate for the memoryless non-linearity of the non-linear amplifier in the predistortion apparatus according to the first embodiment of the present invention, and FIG. 5 is a graph illustrating the convergence of filtering coefficients to compensate for the memory non-linearity of the non-linear power amplifier in the predistortion apparatus according to the first embodiment of the present invention.

Referring to FIGS. 4A and 4B, gain control values and phase control values by which the distortions of an input signal are controlled are stored in the LUT with respect to the signal levels of the input (dBm). These distortion control values are estimated in an adaptation algorithm. It is noted from the gain graph of FIG. 4A that the gain control value is increased significantly at 20 dBm or higher to compensate for a gain which is decreased at a higher input level in the non-linear amplifier. The phase graph of FIG. 4B reveals that since the non-linear amplifier changes phase at a high input level, the phase control value varies with input level, and changes greatly at 20 dBm or higher to compensate for the phase change.

The convergence of filtering coefficients illustrated in FIG. 5 was derived from an exemplary FIR filter having four taps. The four filtering coefficients are denoted as $w_0$, $w_1$, $w_2$ and $w_3$. Each of the filtering coefficients includes a real number part (I channel component) and an imaginary number part (Q channel component). As illustrated in FIG. 5, the FIR filtering coefficients $w^I_0$, $w^Q_0$, $w^I_1$, $w^Q_1$, $w^I_2$, $w^Q_2$, $w^I_3$ and $w^Q_3$ converge to optimum values with time such that the memory effects of the non-linear amplifier are compensated for.

Figure 6A:
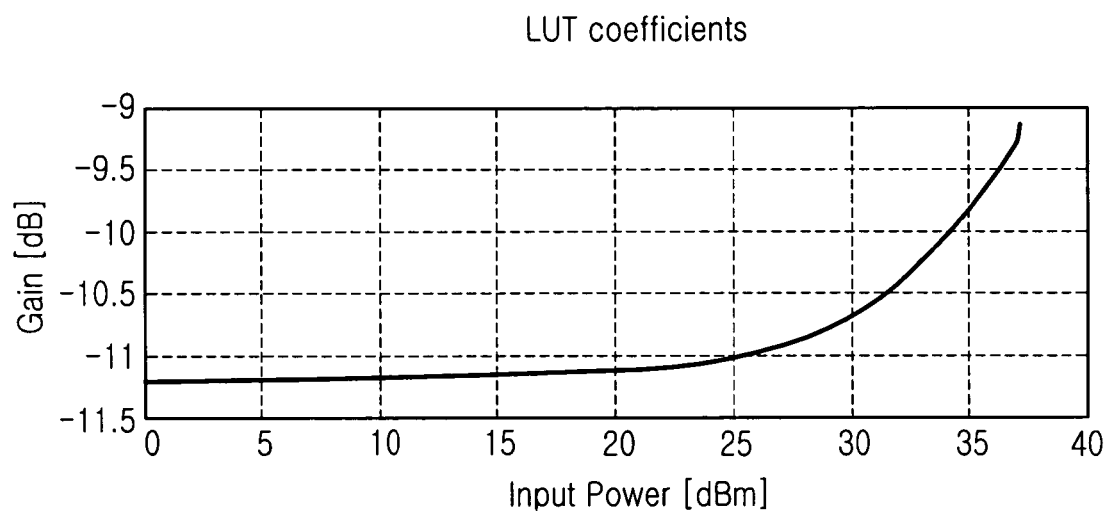
FIGS. 6A and 6B illustrate distortion control values LUT coefficients) stored in a LUT to compensate for the memoryless non-linearity of a non-linear amplifier in a predistorter according to the second embodiment of the present invention.
Figure 6B:
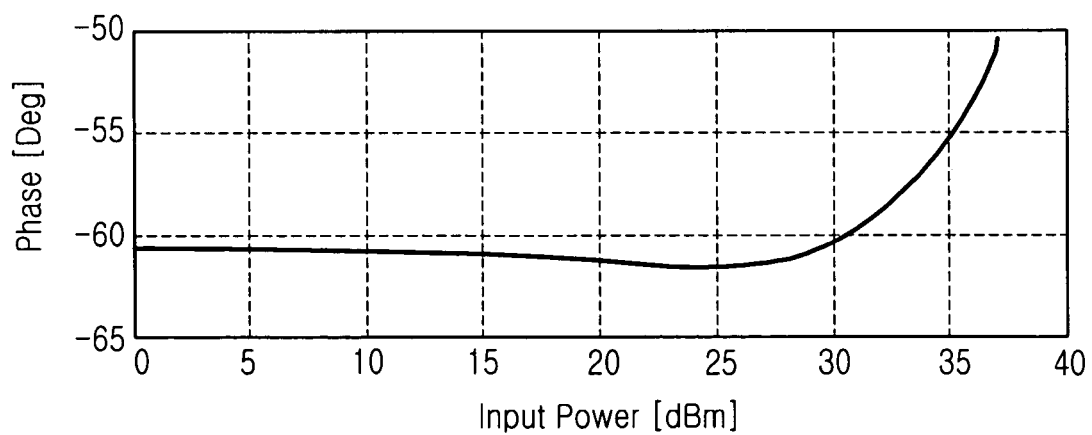
Figure 7:
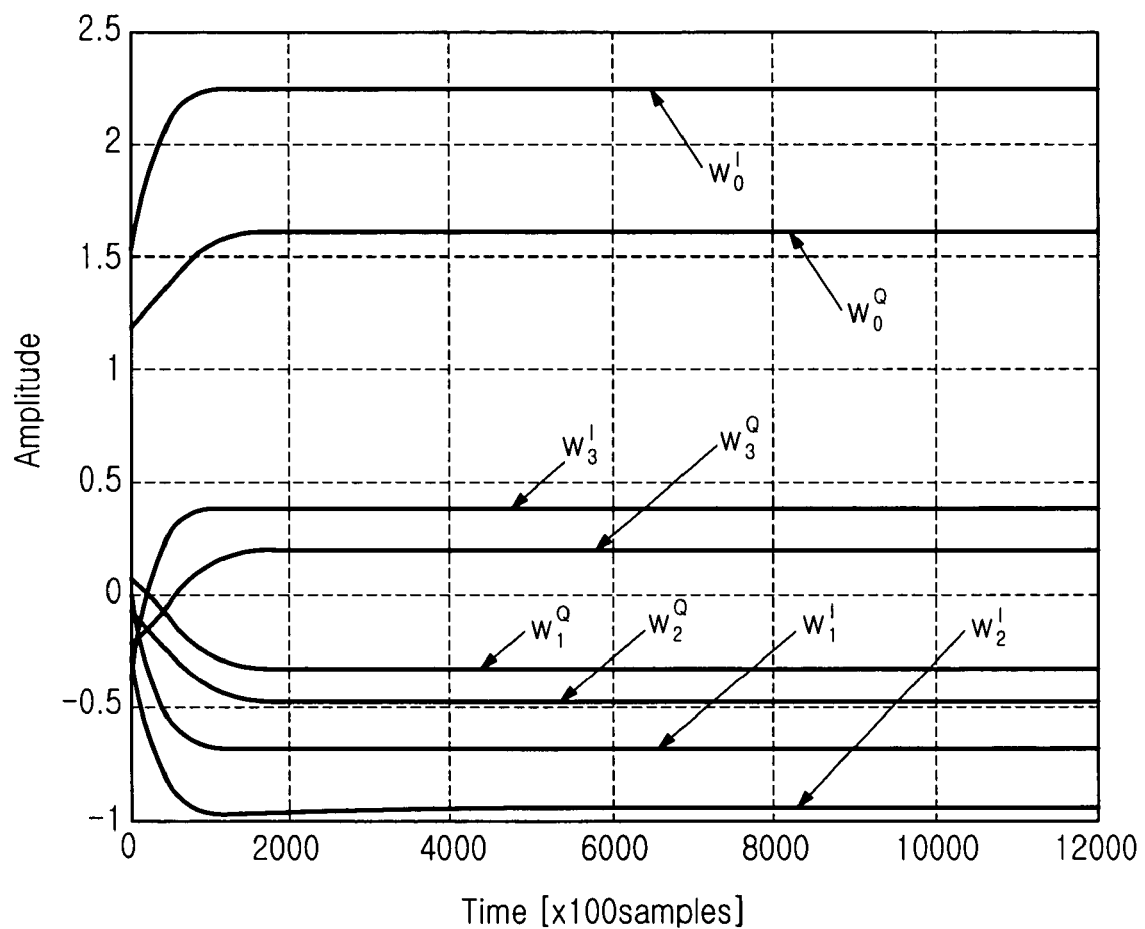
FIG. 7 is a graph illustrating the convergence of filtering coefficients to compensate for the memory non-linearity of the non-linear power amplifier in the predistorter according to the second embodiment of the present invention.

FIGS. 6A and 6B illustrate distortion control values (LUT coefficients) stored in the LUT to compensate for the memoryless non-linearity of the non-linear amplifier in the predistortion apparatus according to the second embodiment of the present invention, and FIG. 7 is a graph illustrating the convergence of filtering coefficients to compensate for the memory non-linearity of the non-linear power amplifier in the predistortion apparatus according to the second embodiment of the present invention.

It is noted from the gain graph of FIG. 6A that the gain control value by which to compensate for the gain non-linearity of the non-linear amplifier is increased significantly at 20 dBm or higher. The phase graph of FIG. 6B reveals that the phase control value by which to compensate for the phase non-linearity of the non-linear amplifier changes greatly at 20 dBm or higher.

Referring to FIG. 7, the four complex filtering coefficients of an FIR filter having four taps $w^I_0$, $w^Q_0$, $w^I_1$, $w^Q_1$, $w^I_2$, $w^Q_2$, $w^I_3$ and $w^Q_3$ converge to optimum values with time such that the memory effects of the non-linear amplifier are compensated for.

Figure 8A:
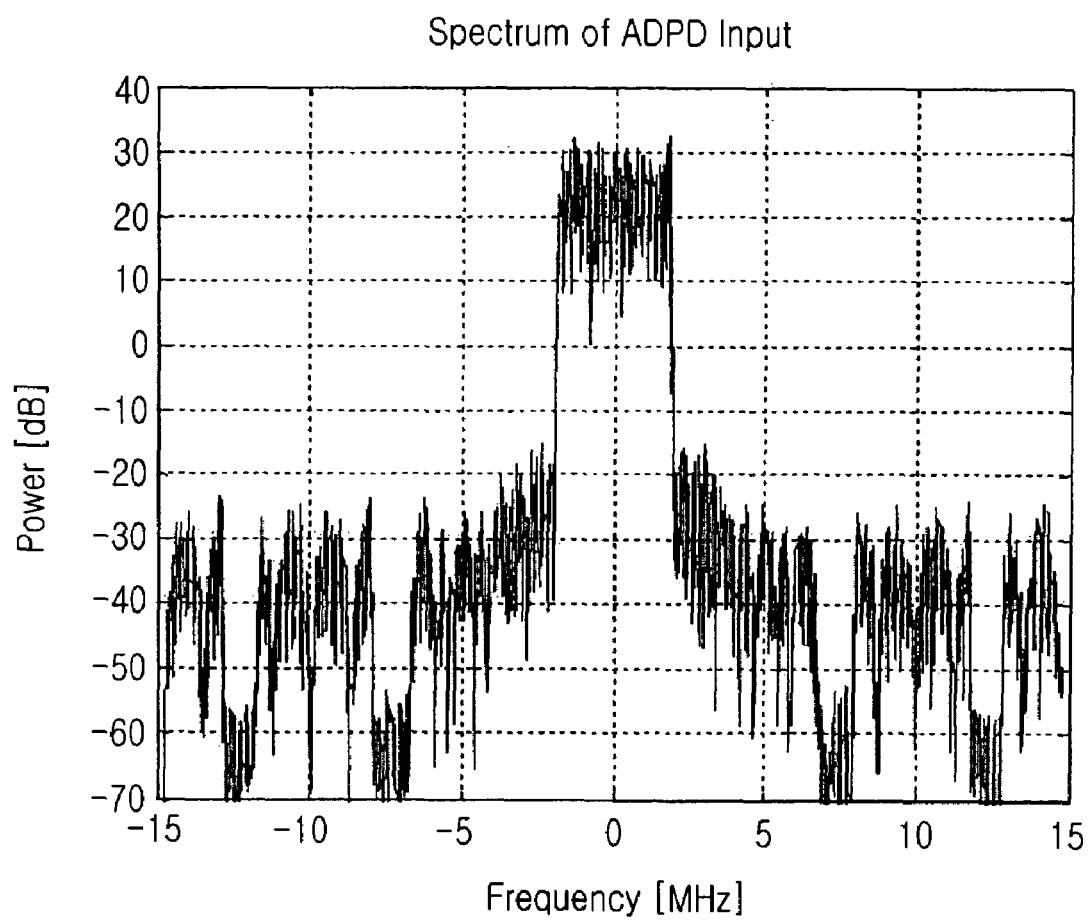
FIGS. 8A through 8C illustrate non-linear and linear amplifications of the spectrum of a transmitter using a predistorter according to an embodiment of the present invention.
Figure 8B:
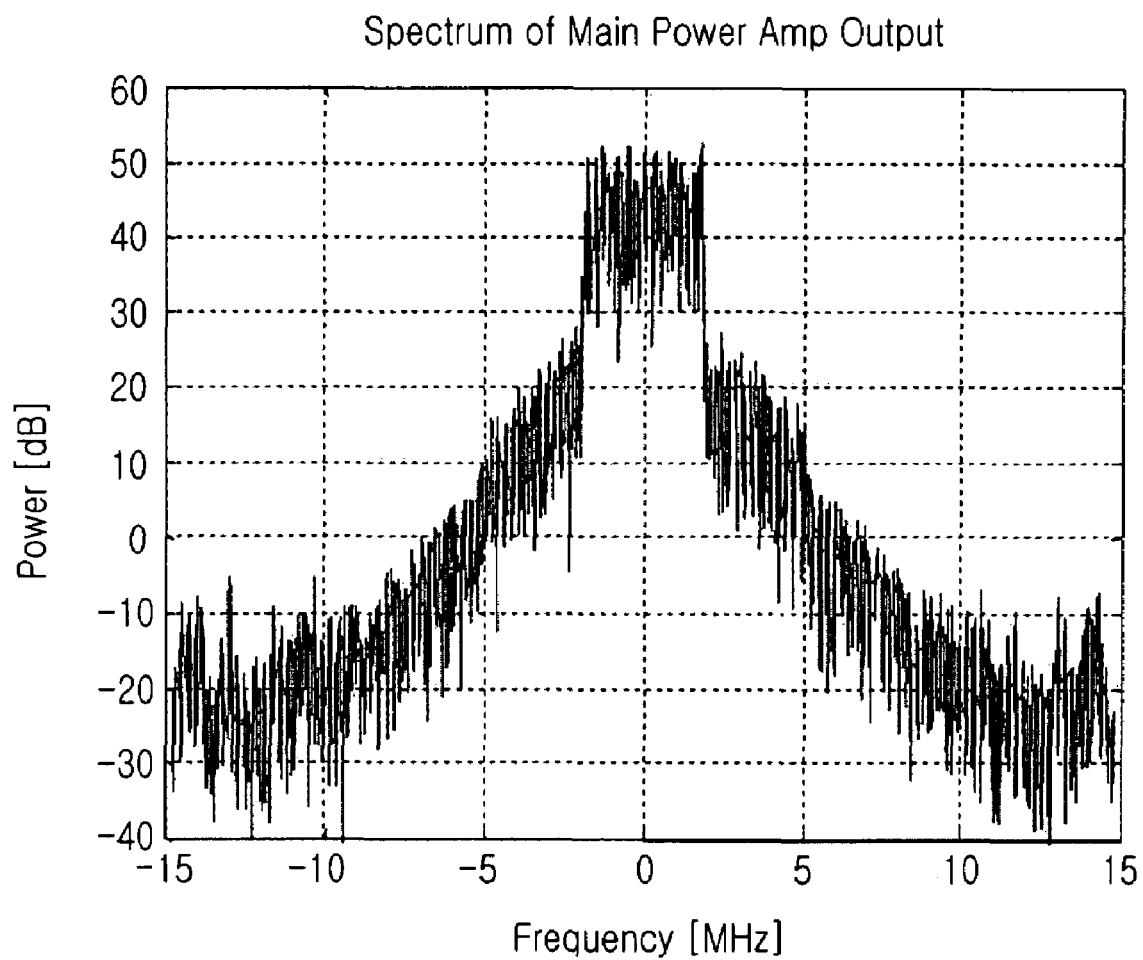

FIGS. 8A and 8B illustrate signal amplification in a transmitter using a predistorter according to the present invention.

FIG. 8A illustrates the spectrum of digital input of the predistorter after Fast Fourier Transform (FFT) in a base band. A signal oversampled 24 times per chip in a Code Division Multiple Access 2000 First Evolution (CDMA2000 1×) system supporting 3-frequency assignment is assumed here.

FIG. 8B illustrates spurious frequencies in the base band, which are output from the non-linear amplifier when the digital input having the spectrum illustrated in FIG. 8A is not predistorted. As illustrated in FIG. 8B, the memoryless non-linearity and memory effects of the non-linear amplifier are represented as spurious signals. It is also noted that the spurious component is increased by about 20 dB, compared to the input spectrum.

Figure 8C:
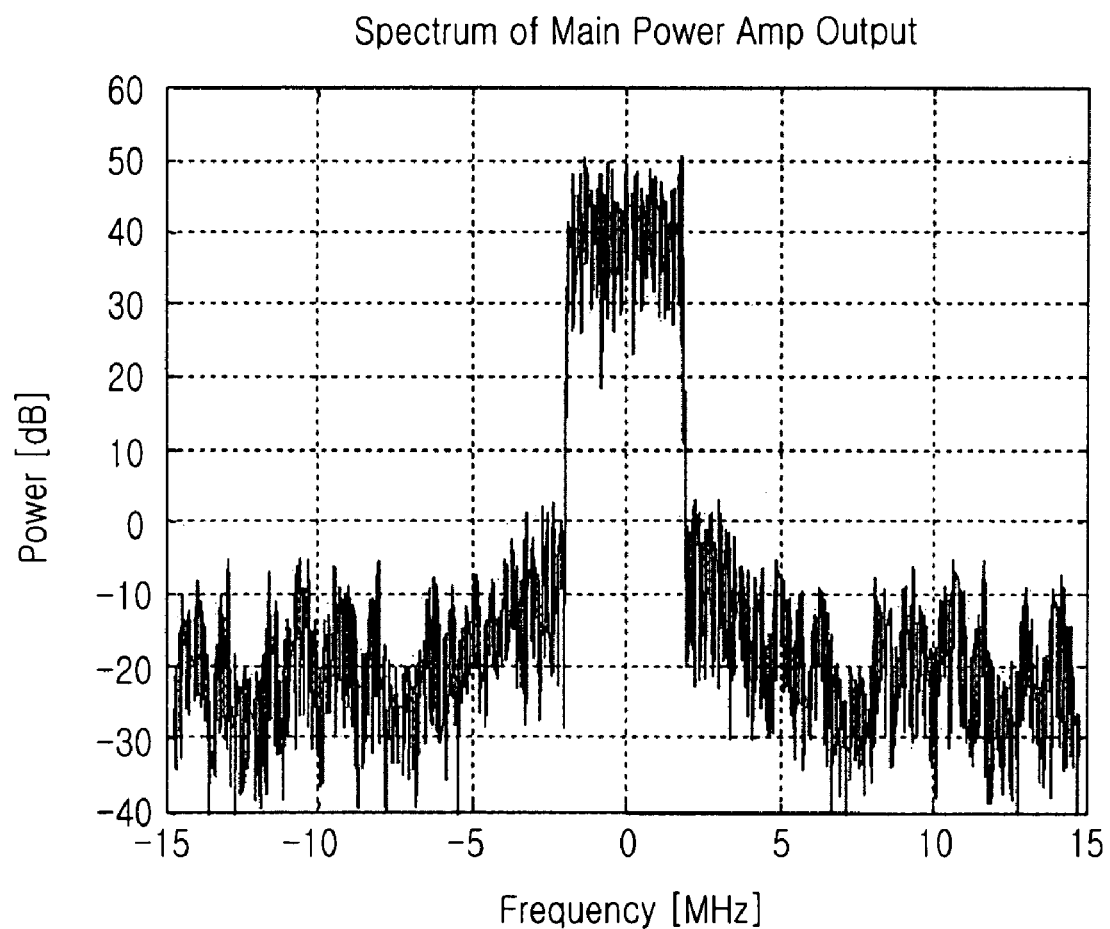

FIG. 8C illustrates the output spectrum of the non-linear amplifier when the digital input having the spectrum illustrated in FIG. 8A is predistorted according to an embodiment of the present invention. As illustrated in FIG. 8C, the input spectrum was linearly amplified with all the memoryless non-linearity and memory effects of the non-linear amplifier eliminated.

The significance of the embodiments of the present invention described will be briefly described. The embodiments of the present invention increase efficiency and yields better performance for a mobile communication transmitter because both in-band and out-of-band spurious components involved in a high-efficiency power amplifier are eliminated. The use of a physical implementable algorithm with a reduced volume of computation through low-order vector calculation in the inventive predistorter leads to rapid data processing and makes the predistorter applicable to mobile communication systems supporting high data rates.

While the invention has been shown and described with reference to certain embodiments thereof, it will be understood by those skilled in the art that various changes in form and details may be made therein without departing from the spirit and scope of the invention as defined by the appended claims.

What is claimed is:

1. A digital predistortion apparatus for predistorting an input digital signal to compensate for memoryless and memory non-linearities of a wideband power amplifier, comprising:
    a first predistorter for receiving the digital signal, the first predistorter being connected to the power amplifier through a digital to analog converter (DAC) and a frequency upconverter and including a first memoryless non-linearity part comprising a first look-up table (LUT) for compensating for the memoryless non-linearity and a first memory non-linearity part comprising a first finite impulse response (FIR) filter for compensating for the memory non-linearity; and
    a second predistorter for receiving an feedback signal from the power amplifier through a frequency downconverter and an analog to digital converter (ADC), the second predistorter including a second memoryless non-linearity part comprising a second LUT having the same values as the first LUT for compensating for the memoryless non-linearity and a second memory non-linearity part comprising a second FIR filter comprising the same filtering coefficients as the first FIR filter for compensating for the memory non-linearity,
    wherein the first predistorter directly updates the first LUT and the second predistorter indirectly updates the first FIR filter using the second FIR filter.

2. The digital predistortion apparatus of claim 1, wherein the first predistorter adaptively updates the first LUT using an input single-tone digital signal.

3. The digital predistortion apparatus of claim 2, wherein the first predistorter updates the first LUT using a secant algorithm expressed as $$F_i(k+1) = \frac{F_i(k-1)e_i(k) - F_i(k)e_i(k-1)}{e_i(k) - e_i(k-1)}$$

where k is an index indicating the number of updates, i is an index indicating an address in the LUT, $F_i(k)$ is a value at an ith address of the LUT updated k times, and $e_i(k)$ is an error obtained by subtracting an estimated amplification value for the input digital signal from a feedback signal output from the power amplifier, the estimated amplification value being the product of the digital signal and an ideal gain for the power amplifier.

4. The digital predistortion apparatus of claim 1, wherein the first memoryless non-linearity part comprises:
   a first amplitude calculator for determining an address in the first LUT by calculating the amplitude of the input digital signal;
   a first multiplier for multiplying a value read from the determined address of the first LUT by the input digital signal and outputting the product to the first memory non-linearity part;
   a first delay for delaying the input digital signal by a predetermined time; and
   an first adaptation controller for updating the first LUT by comparing the input digital signal with the feedback signal.

5. The digital predistortion apparatus of claim 1, wherein the first predistorter adaptively updates the filtering coefficients of the second FIR filter using an input wideband digital signal.

6. The digital predistortion apparatus of claim 5, wherein the second predistorter updates the filtering coefficients of the second FIR filter according to a Normalized Least mean Square (NLMS) algorithm expressed as $$\underline{w}(k+1) = \underline{w}(k) + \frac{\mu \underline{u}(k) e^*(k)}{\|\underline{u}(k)\|^2}$$

where w(k) is a kth coefficient of the FIR filter, u(k) is a signal input to the FIR filter, e is a value obtained by subtracting the output of the FIR filter from the input digital signal, and μ is a predetermined convergence coefficient less than 1.

7. The digital predistortion apparatus of claim 1, wherein the second memoryless non-linearity part comprises:
   a second amplitude calculator for determining an address in the second LUT by calculating the amplitude of the feedback signal received from the power amplifier through the frequency downconverter and the ADC; and
   a second multiplier for multiplying the feedback signal by a value read from the decided address of the second LUT and outputting the product to the second memory non-linearity part;
   wherein the second memory non-linearity part comprises:
   a second delay for delaying a signal received from the first predistorter by a predetermined time; and
   a second adaptation controller for updating the filtering coefficients of the second FIR filter by comparing the signal received from the multiplier with a filtered signal received from the second FIR filter.

8. A method of adapting a digital predistortion apparatus for predistorting an input digital signal to compensate for the memoryless and memory non-linearities of a wideband power amplifier that amplifies the digital signal, the digital predistortion apparatus comprising a first predistorter for receiving the digital signal, the first predistorter being connected to the power amplifier through a digital to analog converter (DAC) and a frequency upconverter and including a first memoryless non-linearity part for compensating for the memoryless non-linearity and a first memory non-linearity part for compensating for the memory non-linearity, and a second predistorter for receiving a feedback signal from the power amplifier through a frequency downconverter and an analog to digital converter (ADC), the second predistorter including a second memoryless non-linearity part for compensating for the memoryless non-linearity and a second memory non-linearity part for compensating for the memory non-linearity, the method comprising:
   receiving a single-tone training signal at the digital predistortion apparatus and adaptively updating a first look-up table (LUT) of the first memoryless non-linearity part;
   applying the update of the first LUT to a second LUT of the second memoryless non-linearity part;
   receiving a wideband training signal at the digital predistortion apparatus and adaptively updating filtering coefficients of a second finite impulse response (FIR) filter of the second memory non-linearity part; and
   applying the updated filtering coefficients to a first FIR filter of the first memory non-linearity part.

9. The method of claim 8, wherein the receiving of the single-tone training signal is performed until the update degree of the first LUT is at a predetermined threshold or below.

10. The method of claim 8, wherein the receiving of the wideband training signal is performed until the update degree of the filtering coefficients is at a predetermined threshold or below.

11. The method of claim 8, wherein the receiving of the single-tone training signal, applying of the update, receiving of the wideband training signal and applying of the updated filtering coefficients are repeated in every predetermined period.

12. A digital predistorter for predistorting an input digital signal to compensate for the memoryless and memory non-linearities of a wideband power amplifier that amplifies the digital signal, comprising:
   a memoryless non-linearity part comprising a look-up table (LUT) for compensating for the memoryless non-linearity and updating the LUT using a feedback signal from the power amplifier; and
   a memory non-linearity part comprising a finite impulse response (FIR) filter for compensating for the memory non-linearity and updating filtering coefficients of the FIR filter using the feedback signal,
   the digital predistorter being coupled to the power amplifier through a digital to analog converter (DAC) and a frequency upconverter, and predistorting the digital signal using the feedback signal received from the power amplifier through a frequency downconverter and an analog to digital converter (ADC).

13. The digital predistorter of claim 12, wherein the LUT is adaptively updated using an input single-tone digital signal.

14. The digital predistorter of claim 13, wherein the LUT is updated by using secant algorithm expressed as $$F_i(k+1) = \frac{F_i(k-1)e_i(k) - F_i(k)e_i(k-1)}{e_i(k) - e_i(k-1)}$$

where k is an index indicating the number of updates, i is an index indicating an address in the LUT, $F_i(k)$ is a value at an ith address of the LUT updated k times, and $e_i(k)$ is an error obtained by subtracting an estimated amplification value for the input digital signal from the feedback signal output from the power amplifier, the estimated amplification value being the product of the digital signal and an ideal gain for the power amplifier.

15. The digital predistorter of claim 12, wherein the filtering coefficients are adaptively updated using an input wideband digital signal.

16. The digital predistorter of claim 15, wherein the filtering coefficients are updated according to a Normalized Least mean Square (NLMS) algorithm expressed as $$\underline{w}(k+1) = \underline{w}(k) + \frac{\mu \underline{u}(k) e^*(k)}{\|\underline{u}(k)\|^2}$$

where w(k) is a kth coefficient of the FIR filter, u(k) is a signal input to the FIR filter, e is a value obtained by subtracting the output of the FIR filter from the input digital signal, and µ is a predetermined convergence coefficient less than 1.

17. A method of adapting a digital predistorter connected to a wideband power amplifier through a digital to analog converter (DAC) and a frequency upconverter, for predistorting an input digital signal using a feedback signal received from the power amplifier through a frequency downconverter and an analog to digital converter (ADC) to compensate for the memoryless and memory non-linearities of the power amplifier that amplifies the digital signal, the digital predistorter comprising a memoryless non-linearity part comprising a look-up table (LUT) for compensating for the memoryless non-linearity and updating the LUT using a feedback signal from the power amplifier, and a memory non-linearity part comprising a finite impulse response (FIR) filter for compensating for the memory non-linearity and updating filtering coefficients of the FIR filter using the feedback signal, the method comprising:

receiving a single-tone training signal at the digital predistorter and adaptively updating the LUT of the memoryless non-linearity part; and receiving a wideband training signal at the digital predistorter and adaptively updating the filtering coefficients of the FIR filter in the memory non-linearity part.

18. The method of claim 17, wherein the receiving of the single-tone training signal is performed until the update degree of the LUT is at a predetermined threshold or below.

19. The method of claim 17, wherein the receiving of the wideband training signal is performed until the update degree of the filtering coefficients is at a predetermined threshold or below.

20. The method of claim 17, wherein the receiving of the single-tone training signal and wideband training signal are repeated in every predetermined period.

\* \* \* \* \*